United States Patent
Schulmann

[11] Patent Number: 5,973,499
[45] Date of Patent: *Oct. 26, 1999

[54] METHOD FOR TESTING ELECTRICAL LOADS IN A VEHICLE ELECTRICAL SYSTEM

[75] Inventor: Siegfried Schulmann, Sindelfingen, Germany

[73] Assignee: DaimlerChrysler AG, Stuttgart, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/764,514

[22] Filed: Dec. 12, 1996

[30] Foreign Application Priority Data

Dec. 13, 1995 [DE] Germany ............. 195 46 553

[51] Int. Cl.⁶ .................................................. G01R 31/02
[52] U.S. Cl. .................... 324/503; 324/429; 324/430; 324/73.1; 324/601; 324/102
[58] Field of Search .................... 340/458, 518, 340/654; 324/126, 503, 504, 429, 430, 102, 433, 601, 73.1

[56] References Cited

U.S. PATENT DOCUMENTS

| | | | |
|---|---|---|---|
| 4,006,319 | 2/1977 | Gartner | 324/430 |
| 4,207,610 | 6/1980 | Gordon | 324/503 |
| 4,207,611 | 6/1980 | Gordon . | |
| 4,290,109 | 9/1981 | Taniguchi | 324/429 |
| 4,423,379 | 12/1983 | Jacobs | 324/427 |
| 4,929,931 | 5/1990 | McCuen | 324/430 |
| 5,337,013 | 8/1994 | Langer | 324/503 |

FOREIGN PATENT DOCUMENTS

| | | |
|---|---|---|
| 0 011 359 | 5/1980 | European Pat. Off. . |
| 21 42 860 | 3/1973 | Germany . |
| 39 23 545 | 1/1991 | Germany . |
| 41 30 978 | 4/1993 | Germany . |
| 43 38 462 | 5/1995 | Germany . |
| WO 92/08141 | 5/1992 | WIPO . |
| WO 93/25916 | 12/1993 | WIPO . |

Primary Examiner—Josie Ballato
Assistant Examiner—Jose M. Solis
Attorney, Agent, or Firm—Evenson, McKeown, Edwards & Lenahan, PLLC

[57] ABSTRACT

A method for testing electrical loads in a vehicle electrical system is provided, in which the loads, which are fed by a vehicle battery, are selectively switched on and off. The load-specific current consumption in the switched-on state is determined and assessed in each case. The battery voltage is measured immediately before and shortly after the switching-off of a previously switched-on load in order to determine the load-specific current consumption value from the load-specific battery voltage difference. The internal resistance of the battery serves indirectly as the measuring resistance, which is determined by loading the battery with a known load on a trial basis.

11 Claims, 2 Drawing Sheets

METHOD FOR TESTING ELECTRICAL LOADS IN A VEHICLE ELECTRICAL SYSTEM

BACKGROUND AND SUMMARY OF THE INVENTION

The invention relates to a method for testing electrical loads and, more particularly, to a method for testing electrical loads in a vehicle electrical system, in which the loads, which are fed by a vehicle battery, are selectively switched on and off. The load-specific current consumption in the switched-on state is determined and assessed in each case. Such a method is particularly suitable for computer-aided functional testing of the vehicle electrical system and components.

German patent document DE-B 21 42 860 discloses a method of the above-mentioned type which uses a battery adapter having integrated therein a measuring resistor and, connected thereto, an A/D converter which is connected as a voltmeter. Provided with appropriately matched connections, the battery adapter is clamped to an exposed battery terminal, on the one hand, and, on the other hand, to the battery cable previously removed from the battery terminal. The battery adapter is connected to diagnostic computer via an input/output unit. During the functional testing, the service engineer charged with testing the vehicle activates the electrical loads in the vehicle in accordance with test specifications which are prescribed to him by the diagnostic computer via a screen. The current consumption is simultaneously measured by means of the battery adapter and compared with load-specific desired values in the diagnostic computer. A fault message is issued in the event of a significant deviation.

A similar method is described in German patent document DE 39 23 545 A1. This document provides for the temporary insertion of a precision measuring resistor (shunt) into the main current path between the battery of the vehicle and the loads, for example in the place of a previously removed main fuse. The voltage drop across the resistor is evaluated for the purpose of measuring the current. The loads are activated by a diagnostic computer which issues corresponding commands to a vehicle-internal diagnostic line via a diagnostic socket outlet.

The previously described methods require a measuring resistor on which the measurement voltage is tapped. This results in additional costs irrespective of whether this measuring resistor is installed permanently or just temporarily for measurement purposes. The installation and removal are time-consuming, particularly in the case of modern vehicle types whose fuse box and, to an even greater extent, battery are often accessible only with great difficulty. Furthermore, the reconnection of the battery cable to the battery terminal or the reinsertion of the fuse often hides additional fault sources.

A further method of the above-mentioned type which, however, circumvents the installation and removal of a measuring resistor is disclosed in German patent document DE 41 30 978 A1. In this document, the fuses connected upstream of the loads are used as measuring resistors whose voltage drops are picked-off by a test plug engaging on the fuses. The voltage drops are evaluated by an external test instrument which beforehand carries out a conventional resistance measurement at the respective fuse for the purpose of normalizing the current values. This method may be deemed to suffer from the disadvantage that reliable handling of the test plug depends on the easy accessibility of the fuse box.

Furthermore, German patent document DE 43 38 462 A1 discloses a method of the above-mentioned type in which, in order to determine the current consumption of a selectively switched-on load to be tested, use is made of the voltage drop across the load which is caused by an impressed constant current. This method suffers from the disadvantage, inter alia, that a separate constant-current source is required in addition to the battery.

There is therefore needed a method which can be used to determine the current consumption of selectively switched-on loads in the vehicle in a simple and reliable manner.

These needs are met by a method for testing electrical loads in a vehicle electrical system, in which the loads, which are fed by a vehicle battery, are selectively switched on and off. The load-specific current consumption in the switched-on state is determined and assessed in each case. In order to determine the current consumption, the battery voltage is measured, immediately before and shortly after the switching-off of the previously switched-on load and the load-specific current consumption is determined from the voltage difference.

The invention exploits the fact that every load switching instance in the vehicle electrical system produces a slight sudden voltage change at the battery. Since the method according to the invention evaluates the battery voltage or vehicle electrical system voltage directly in order to determine the current consumption, with the internal resistance of the battery serving indirectly as the measuring resistance, a separate measuring resistor provided for measurement purposes is not required. For this reason, measurement lines for picking-off a voltage drop are also eliminated. The battery or vehicle electrical system voltage can be tapped remotely from the battery, for example at a diagnostic socket outlet, and is usually monitored in any case. The adaptation outlay is therefore low and independent of the accessibility of the battery. A further advantage is that the signal voltages of the sudden changes in the battery or vehicle electrical system voltage are significantly larger than the voltage drops across a measuring resistor which are evaluated in the known methods, for which reason the method according to the present invention is more sensitive and less susceptible to interference. The method according to the invention is cost-effective and can be employed during the production of the vehicle, during after-sales service or in a self-diagnostic system integrated in the vehicle (on-board diagnosis).

In an equivalent circuit diagram, the battery essentially comprises an electrochemical voltage source, a large parallel discharge resistance and a small series internal resistance, which is designated below as battery resistance or internal resistance. When current flows, the battery terminal voltage is therefore reduced by the voltage drop across the battery resistance in comparison with the voltage of the electrochemical voltage source.

In the event of a quantitive evaluation of the battery voltage for the purpose of determining the current, it should be taken into account, however, that when current is drawn for a relatively long time, the voltage of the electrochemical voltage source also decreases non-linearly as a function of the residual capacity, the temperature and the discharge current. When the load is removed, the voltage gradually rises again due to chemical processes. This slow response of the electrochemical voltage source overlies the influence of the battery resistance and is difficult to detect.

However, if the immediate response of the battery to rapid current changes considered is then it is found that only the internal resistance of the battery is effective during this brief time. On account of the high capacity and the slowly proceeding chemical processes, the voltage of the electrochemical voltage source can be regarded as being constant at that moment.

The invention therefore provides for the evaluation only of rapid load current changes in the vehicle electrical system, since these changes bring about a proportional sudden voltage change which is essentially determined solely by the battery resistance. The current consumption of a load can be acquired in a reproducible manner, in particular, by measuring the voltage difference at the changeover instant, that is to say at the instant when the load is switched on or off.

Furthermore, the method according to the present invention advantageously provides for the evaluation only of the sudden voltage change when the load is switched off. An evaluation of the sudden voltage change when the load is switched on would be inaccurate, since some loads exhibit a pronounced transient response. For example, vehicle lamps require a high switching-on current when they are switched on, on account of the initially cold incandescent filament of the lamp. The voltage difference measured during switching on would then be greatly dependent on the time interval between the two measurements. A reproducible measurement of the battery voltage is therefore not produced until after the transient processes have died away. This also applies to evaluation of the sudden voltage change when the load is switched off. The switched-on time prior to switching off must therefore be selected to be long enough for the transient processes which are typical of some loads to be able to take place.

In an advantageous development, the measured, load-specific voltage differences are normalized by means of a reference value, which is formed by a voltage difference emerging when the battery is loaded on a trial basis with a known load. The reference value can be determined anew at any time as required, with the result that the influence, which varies slowly with time, of battery capacity, charge state and aging of the battery on the internal resistance of the battery is eliminated from the evaluation of the load-specific voltage differences.

Other objects, advantages and novel features of the present invention will become apparent from the following detailed description of the invention when considered in conjunction with the accompanying drawings.

DETAILED DESCRIPTION OF THE DRAWINGS

Figure 1:
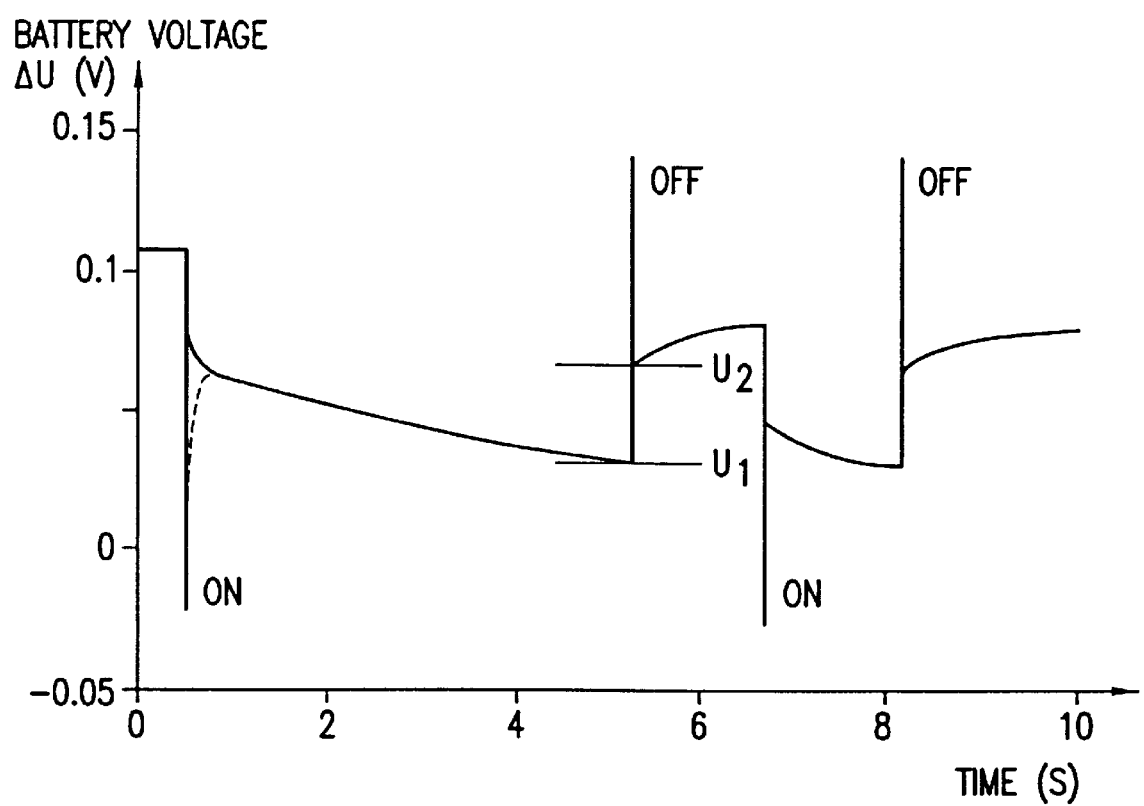
FIG. 1 is a graph showing a typical characteristic of the battery voltage when a load is switched on and off.

In the voltage characteristic illustrated in FIG. 1, a DC voltage component of a battery is compensated for, in order that the battery voltage changes $\alpha U$ can be portrayed with greater accuracy. A fixed resistor was used as the load and was switched on and off at irregular time intervals (states ON and OFF). As the solid line shows, the battery voltage changes abruptly when the load is switched on and off, a switching pulse being superposed on the voltage steps.

The stepwise change in the battery voltage can be attributed to the voltage drop across the internal resistance of the battery and directly follows the rapid changes in the load current when the load is switched on and off. In contrast, the slow changes in the battery voltage in the switched-on and switched-off states reflect the reaction kinetics in the electrochemical voltage source as the latter is discharged and recovers, respectively. The sudden voltage change from the voltage U1 (immediately prior to switching-off) to the voltage U2 (shortly after switching-off) therefore corresponds to the product of the internal resistance and the load current of the load and is largely independent of the reaction kinetics of the electrochemical voltage source. The voltage difference U2–U1 can therefore be used to determine the internal resistance of the battery when the current is known, or the load current of a load when the internal resistance is known.

The measurement of the voltage U2 after the switching-off of the load must not be carried out until after the inductive transient decays—and delete "a switching pulse" and insert—an inductive transient; in other words after a switching pulse time of a few milliseconds, for example 3 msec. The switching off event itself can be used as a trigger pulse in order to store, from continuously recorded voltage values, the voltage U1 shortly before switching off and the voltage U2 after the inductive transient. The measurement of the voltage difference U2–U1 can thus proceed automatically, in which case the respective load is switched on and off either by the operator or a connected diagnostic computer.

The fixed resistor exhibits no transient response at all and corresponds in terms of its response time, for example, to the rear-window heater as the load to be tested. If a load exhibits no transient response, the sudden voltage change when the load is switched on can also be used for determining the internal resistance of the battery or the load current.

Most of the loads in the vehicle exhibit a characteristic transient response with a transient response time of a few hundred msec. The typical transient response for the case of a vehicle lamp is illustrated as a dashed line in FIG. 1, which transient response can be attributed to the heating of the incandescent filament having a positive temperature coefficient, the heating not starting until the lamp is switched on.

Although it is possible also to evaluate the transient process, for example with pattern recognition methods, this is very complicated. Generally, the voltage characteristics upon activating specific loads could be stored as patterns and used to assess specific functions such as, for example, the switched-on duration of a load, the closing time of windows or the running duration of pumps for pressure build-up and pressure retention. When considering the measurement signal of electric-motor loads such as, for example, electric window drivers, it is shown, specifically, that an alternating voltage is superposed on the slowly varying voltage signal, which alternating voltage stems from the commutation current of the electric motor. The evaluation of this alternating voltage signal enables conclusions to be drawn about the rotational speed of the motor and the running speed. The rotational speed of the motor can additionally be used to assess the travel and the speed of the moving part.

The method according to the present invention, which is directed at a simple checking of the electrical system and components in the vehicle, circumvents from the outset the evaluation difficulties associated with the transient processes by evaluating the sudden voltage change when the loads are switched off.

Figure 2:
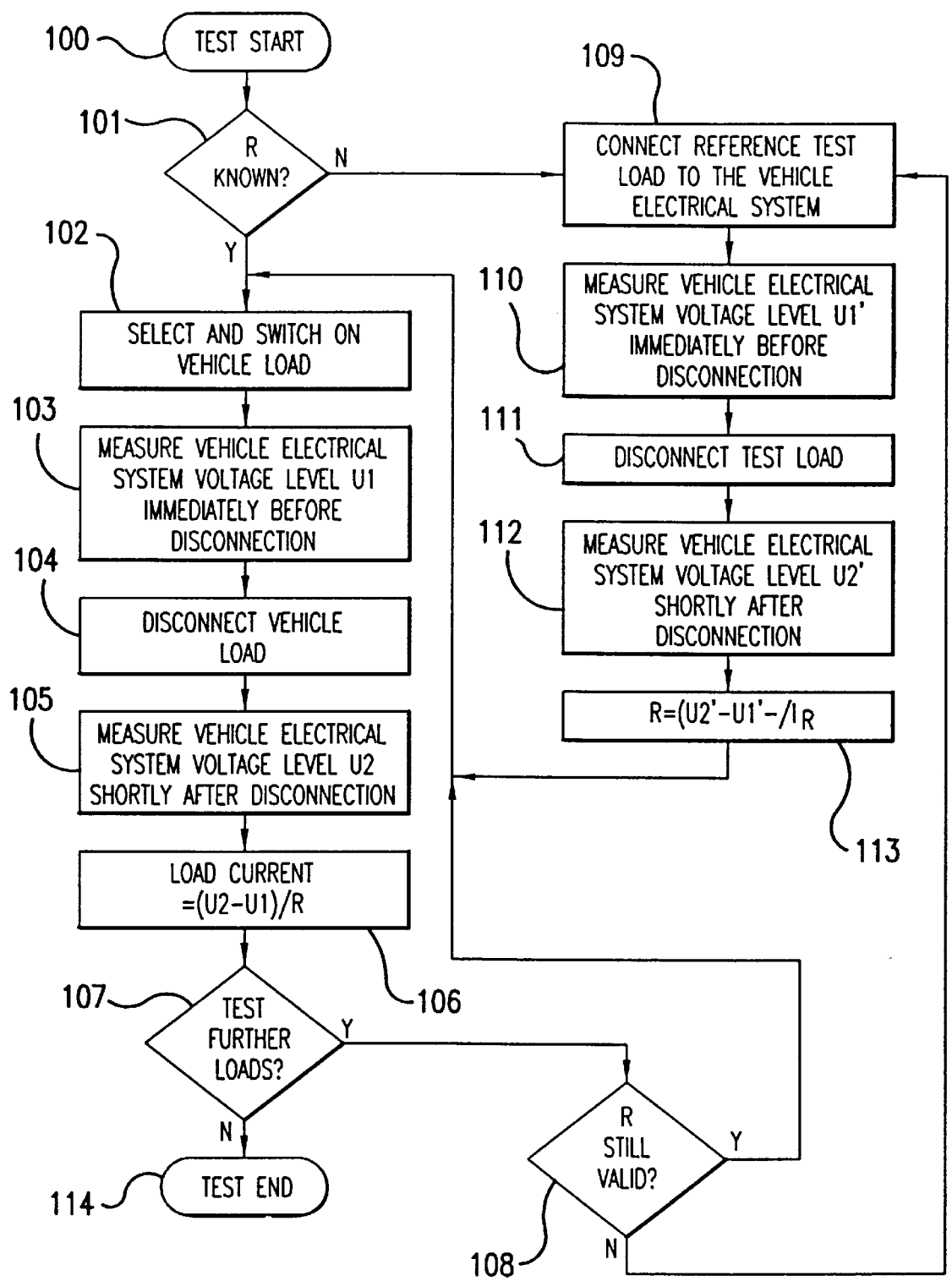
FIG. 2 is a flow diagram of the method sequence according to the present invention.

The flow diagram illustrated in FIG. 2 converts the principle explained above into an automated test sequence. After the test start 100, it is determined in an interrogation step 101 whether the internal resistance R is known. If the latter is not known, the internal resistance is determined, and a value is allocated to the variable R, in a subordinate test sequence 109–113.

When the internal resistance R is known, a load is selected and switched on in step 102. In a following step 103, which must not be carried out until after the transient recovery time has elapsed, which may take a few hundred msec for some loads, but immediately precedes the switching-off (step 104) of the load, the applied vehicle electrical system voltage U1 is measured and recorded. In practice, the procedure may be such that, in the switched-on state, the voltage is continually recorded at brief time intervals and stored in a buffer, the last value being read from the buffer, after having beer triggered by the switching-off pulse, and being allocated to a variable U1.

Shortly (approximately 5 msec) after the load has been switched off (step 104), that is to say after the resulting inductive transient has decayed, the vehicle electrical system voltage is measured and stored as the variable U2 (step 105). In the following step 106, the voltage difference U2–U1 is formed from the two stored voltage values U1, U2 and is normalized with the value for the internal resistance R. The result is allocated to a variable for the load current, which variable is available to the superordinate diagnostic sequence and can be displayed, for example, to the service engineer who is carrying out the test.

An interrogation is carried out in the following interrogation 107 to see whether or not further loads are still to be tested. If no further loads are to be tested, the test end (step 114) is reached.

If further loads are to be tested, an interrogation 108 is first of all carried out to see whether or not the existing value for the internal resistance R can continue to be used as a basis. This interrogation 108 can be addressed to the service engineer, who bases his decision on values determined from his experience. Experience shows that a single determination of the value for the internal resistance suffices to carry out a test series in which all of the loads are briefly tested once. As an alternative, the interrogation 108 can be answered by a subroutine comprising plausibility interrogations in which the current consumptions already determined for different loads are compared with one another.

If the existing value for the internal resistance R cannot be used further, the internal resistance is determined, and a value is allocated to the variable R, in the subordinate test sequence 109–113. Otherwise, there is an immediate return to before step 102 of the main method sequence, in which a load is selected and switched on.

In the subordinate test sequence 109–113 for determining the internal resistance R, a reference test load is connected to the vehicle electrical system (step 109) and then a first voltage measurement (step 110) is carried out immediately before the disconnection of the test load (step 111), and shortly thereafter a second voltage measurement (step 112) is carried out. That which applies to the voltage measurements in the main method sequence (steps 103–105) applies correspondingly to the recording of the two voltage values U1' and U2'.

After the voltages U1' and U2' have been measured, in a further step 113 the voltage difference U2'–U1' is divided by the known current $I_R$ of the reference test load and the result is allocated to the variable R for the internal resistance. This presupposes that the known test load is a current sink with a defined constant current which is set to a typical value between 1 A and 7 A. Such a current sink is easy to realize in terms of circuitry and can be integrated into the test instrument connected to the diagnostic socket output. Using the current sink as a reference test load permits an absolute measurement of the load current of the loads. If, for example, the constant current is fixed at 1 A, then the load current of the load to be tested results in step 106 directly from the ratio of the voltage difference U2–U1 of the load to be tested to the voltage difference U2'–U1' of the reference test load, the numerical value determined indicating the current in the customary unit "amperes".

As an alternative to a constant-current sink, it is also possible to use a non-reactive resistor as the reference test load. However, the ratio of the voltage difference U2–U1 of the load to be tested to the voltage difference U2'–U1' of the reference test load then produces a numerical value which indicates the load current in multiples of the current flowing through the reference resistor. Step 106 would then have to be modified in the manner Load current/$I_R$=(U2−U1)/(U2'−U1'), in which case the voltage difference (U2'–U1') would be formed in step 113.

If the reference resistor is always the same, reproducible load current measurements can also be carried out using this method.

In particular, one of the loads in the vehicle can be used as the reference test load. Suitable loads are those which have low manufacturing tolerances and exhibit a voltage characteristic which is as simple as possible. It is thus possible, for example, to select as the reference test load the right-hand parking light which consumes a current of approximately 1 A in the switched on state in the vehicle electrical system, this value being present only for a specific battery voltage. In the event of load current measurement in accordance with the method of the invention, the load current for the other loads is then given as a multiple of the parking light current. If the load to be tested is the left-hand parking light, for example, then the ratio of the voltage differences results in the numerical value 1, since both parking lights have an identical current consumption, provided that they are not defective. Correspondingly, the numerical value of approximately 8 would be given for the fog light or main beam, since their current consumption is approximately 8 A for example. The rear-window heater having a high current consumption of approximately 23 A would result in a numerical value of 23 for example.

The relative current figures presuppose that the reference test load functions properly. This can be ensured by means of plausibility checks of the recorded load-specific voltage differences.

Although the refinement of the method according to the present invention which was last explained permits only relative current figures, it is, in return, cost effective because the electrical checking of the loads already succeeds with an improved evaluation of the vehicle electrical system voltage and does not require any additional circuitry. This refinement of the method is therefore particularly suitable for on-board systems for vehicle self-diagnosis (on-board diagnosis).

In the course of a test procedure, the current consumptions of the loads—directly or put as a ratio with the current consumptions of other loads—are compared with stored comparison values. The load-specific comparison values required for identifying a defect must be stored in each case in a memory. These comparison values either are read in by data transmission or are recorded by the vehicle-dedicated (on-board) diagnostic system in a learning procedure.

The method according to the invention enables simple checking of the electrical loads in the vehicle, these being, in particular, any type of lights (parking light, side light, fog light, rear fog light, dipped beam, main beam, flashing indicator light, headlight flasher, interior lighting), heaters (rear-window heater, seat heater), actuator motors (for example for electric window winders (drivers) or a sliding sunroof) and other electrical auxiliary motors (for example pumps).

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method for testing electrical loads in a vehicle electrical system in which said loads are fed by a vehicle battery and are selectively switched on and off, with a load-specific current consumption in a switched-on state being determined and assessed in each case, the method comprising the steps of:

measuring a battery voltage of the vehicle battery immediately before switching-off a previously switched-on load and again after the load is switched off once an inductive transient decays in order to determine a current consumption; and determining the load-specific current consumption from a voltage difference between the battery voltage measured before the switching-off and after the switching-off.

2. The method according to claim 1, wherein in order to determine the load-specific current consumption, the method further comprises the step of putting the measured load-specific voltage difference into a ratio with a reference voltage difference previously measured in an identical manner for a reference test load.

3. The method according to claim 2, wherein said reference test load is a current sink having a defined constant current.

4. The method according to claim 2, wherein said reference test load is one of a non-reactive resistor and a specific load already in the vehicle.

5. The method according to claim 1, wherein said previously switched-on load is not switched-off until a switched-on time, which is greater than a transient recovery time of said load, has elapsed.

6. The method according to claim 1, wherein said switching-off of the load triggers one of the voltage measurement and a storage of corresponding measured values immediately before and shortly after the switching-off.

7. The method according to claim 2, further comprising the steps of comparing current consumption values already determined for different loads so as to establish whether the reference voltage difference being used in the method can still continue to be used or must be recorded anew.

8. The method according to claim 1, wherein in order to identify a defect, the current consumption values determined are compared with comparison values stored in a memory, said comparison values either being read-in by data transmission or recorded by a vehicle-dedicated diagnostic system during a learning procedure.

9. A method according to claim 1, wherein the measuring of the battery voltage of the vehicle battery immediately before the switching-off of the load is performed after a decay of slow varying transients of the load.

10. A method for testing an electrical load in a vehicle electrical system in which said load is fed by a vehicle battery and is selectively switched on and off, with a load-specific current consumption in a switched-on state of the load being determined and assessed, the method comprising the steps of:

switching-on the load to be tested;

measuring a battery voltage of the vehicle battery immediately before switching-off the load to be tested;

measuring the battery voltage of the vehicle battery after the load is switched-off and an inductive transient decays;

determining the load-specific current consumption from a voltage difference between the battery voltage measured immediately before switching-off the load and after the load is switched-off.

11. A method according to claim 10, wherein the measuring of the battery voltage shortly after the switching-off of the load is performed after approximately 3 milliseconds.

* * * * *